(12) United States Patent  
Palacios et al.

(10) Patent No.: US 8,188,459 B2
(45) Date of Patent: May 29, 2012

(54) DEVICES BASED ON SI/NITRIDE STRUCTURES

(75) Inventors: Tomas Palacios, Cambridge, MA (US); Jinwook Chung, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 268 days.

(21) Appl. No.: 12/577,892

(22) Filed: Oct. 13, 2009

(65) Prior Publication Data
US 2010/0032717 A1 Feb. 11, 2010

Related U.S. Application Data

(63) Continuation-in-part of application No. PCT/US2008/060200, filed on Apr. 14, 2008.

(60) Provisional application No. 60/923,094, filed on Apr. 12, 2007.

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ...... 257/20; 257/24; 257/192; 257/E29.229

(58) Field of Classification Search ............ 257/20, 257/24, 57, 124, 183, 192, 213, 288, 613, 257/E29.229
See application file for complete search history.

(56) References Cited

U.S. PATENT DOCUMENTS

| | | |
|---|---|---|
| 2002/0117681 A1 | 8/2002 | Weeks et al. |
| 2005/0006639 A1 | 1/2005 | Dupuis et al. |
| 2005/0133816 A1* | 6/2005 | Fan et al. ............ 257/190 |
| 2005/0173728 A1 | 8/2005 | Saxler |
| 2006/0138457 A1 | 6/2006 | Otsuka et al. |
| 2007/0051977 A1 | 3/2007 | Saito et al. |

OTHER PUBLICATIONS

Buttari et al., "Systematic Characterization of Cl2 Reactive Ion Etching for Gate Recessing in AlGaN/GaN HEMTs" IEEE Electron Device Letters, IEEE Service Center, Mar. 1, 2002, pp. 118-120.

* cited by examiner

*Primary Examiner* — Hoai V Pham
(74) *Attorney, Agent, or Firm* — Gesmer Updegrove LLP

(57) ABSTRACT

A nitride-based semiconductor device is provided. The nitride-base semiconductor device includes a substrate comprising one or more locally etched regions and a buffer layer comprising one or multiple InAlGaN layers on the substrate. A channel layer includes GaN on the buffer layer. A barrier layer includes one or multiple AlGaN layers on the channel layer.

18 Claims, 13 Drawing Sheets

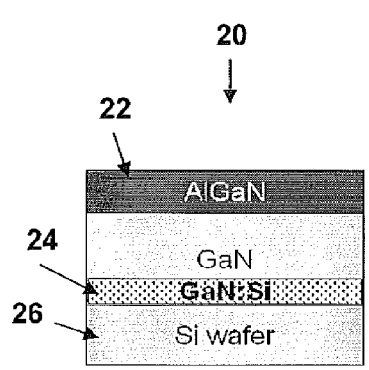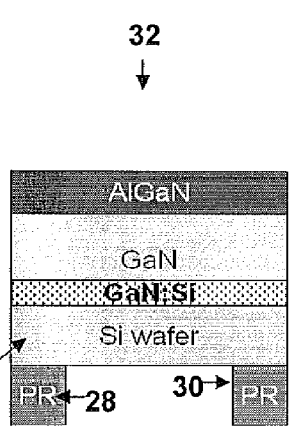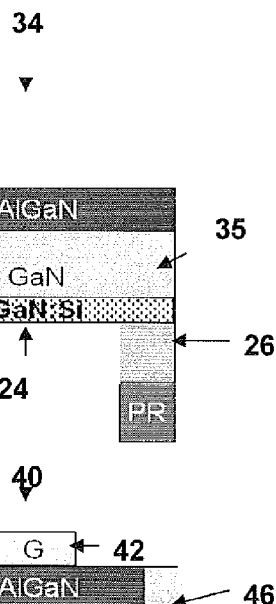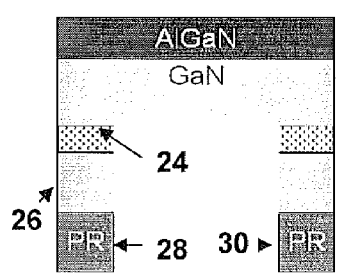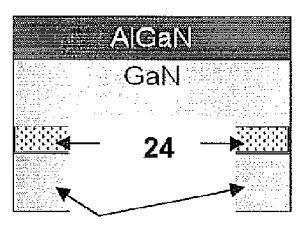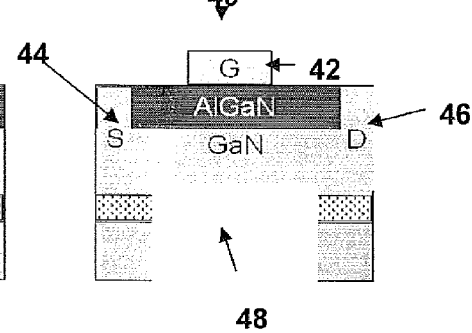
FIG. 3A  FIG. 3B  FIG. 3C
FIG. 3D  FIG. 3E  FIG. 3F FIG. 7A
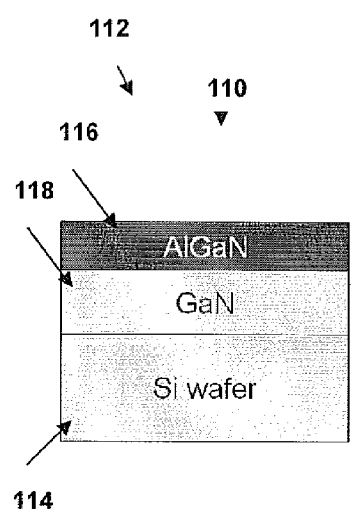
FIG. 7B
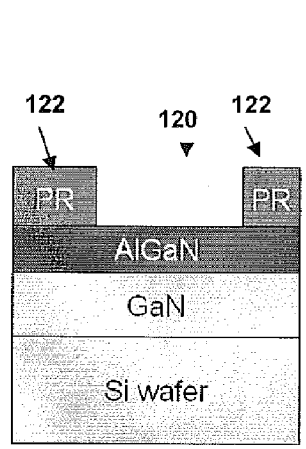
FIG. 7C
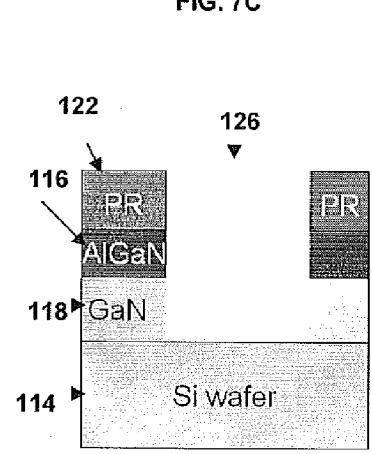
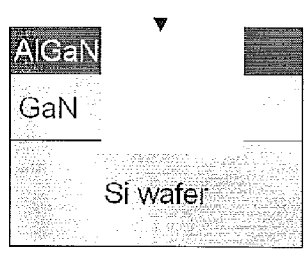
FIG. 7D
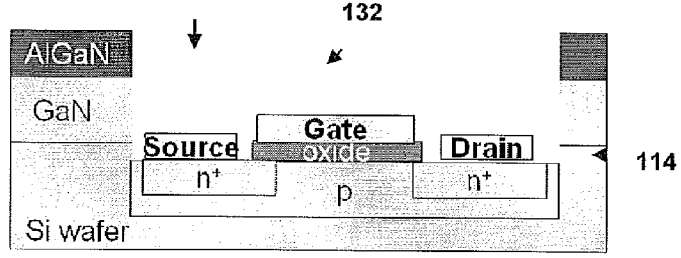
FIG. 7E

DEVICES BASED ON SI/NITRIDE STRUCTURES

PRIORITY INFORMATION

This application claims priority from provisional application Ser. No. 60/923,094 filed Apr. 12, 2007 and is a continuation-in-part application of PCT application PCT/US08/060200 filed on Apr. 14, 2008, which are incorporated herein by reference in their entireties.

BACKGROUND OF THE INVENTION

The invention relates to the field of transistor structures, and in particular to a transistor formed using Si/nitride structures.

State-of-the-art commercial GaN transistors are normally grown on SiC substrates. In spite of the excellent performance of these devices, their commercialization is severely hindered by the high cost of SiC wafers. To reduce cost, GaN transistors have also been grown on Si substrates (normally >10 times cheaper than SiC). However, the performance of these devices is limited by the high electrical conductivity and poor thermal conductivity of the Si substrate.

SUMMARY OF THE INVENTION

According to one aspect of the invention, there is provided a nitride-based semiconductor device. The nitride-base semiconductor device includes a substrate comprising one or more locally etched regions and a buffer layer comprising one or multiple InAlGaN layers on the substrate. A channel layer includes GaN on the buffer layer. A barrier layer includes one or multiple AlGaN layers on the channel layer.

According to another aspect of the invention, there is provide a nitride-based semiconductor device. The nitride-based semiconductor device includes a substrate comprising one or more locally etched regions. A buffer layer includes one or more InAlGaN layers on the substrate. An etch-stop layer includes InAlGaN on the buffer layer. Also, a channel layer includes GaN on the etch-stop layer. In addition, a barrier layer includes one or more AlGaN layers on the channel layer.

According to another aspect of the invention, there is provided a field effect transistor. The field effect transistor includes a substrate comprising one or more locally etched regions. A buffer layer includes one or more InAlGaN layers with one or more locally etched regions on the substrate. A channel layer includes GaN on the buffer layer. Also, a barrier layer includes one or more AlGaN layers positioned on the channel layer. Moreover, a plurality of ohmic contacts in electrical communication with the channel layer to form a source or drain. One or more gate contacts are positioned on the barrier layer.

According to another aspect of the invention, there is provided a field effect transistor. The field effect transistor includes a substrate comprising one or more locally etched regions. A buffer layer includes one or more InAlGaN layers with one or more locally etched regions on the substrate. A channel layer includes GaN on the buffer layer. Moreover, a barrier layer includes one or more AlGaN layers positioned on the channel layer. A plurality of ohmic contacts in electrical communication with the channel layer forms a source or drain. Also, one or more gate contacts on the barrier layer.

According to another aspect of the invention, there is provided a method of manufacturing a field effect transistor. The method includes forming a plurality of ohmic contacts in electrical communication with a channel layer. Also, the method includes forming local trenches through a substrate and a buffer layer to expose the channel layer. Moreover, the method includes performing a conductivity enhancing treatment on the channel layer through the local trenches to produce an implanted region. The metal contacts are formed on the barrier layer so as to produce source and drain regions. Electrical connections are formed between the metal contacts and the implanted region by thermal annealing. Furthermore, the method includes positioning a gate contact on the barrier layer.

According to another aspect of the invention, there is a method of manufacturing a field effect transistor. The method includes forming a plurality of ohmic contacts in electrical communication with a channel layer. Also, the method includes forming local trenches through a substrate and a buffer layer to expose the channel layer. In addition, the method includes forming a plurality of metal contacts underneath the channel layer where the ohmic contacts are positioned. Electrical connections are formed between the metal contacts and the channel layer by thermal annealing. Furthermore, the method includes positioning a gate contact on a barrier layer.

BRIEF DESCRIPTION OF THE DRAWINGS

FIGS. 3A-3F are process flow graphs of the selective removal of the Si wafer and Si-doped GaN material in the buffer of an AlGaN/GaN HEMT;

FIGS. 7A-7E are examples of a process flow graph for the integration of Si CMOS electronics in GaN-on-Si wafers;

DETAILED DESCRIPTION OF THE INVENTION

The invention involves several new technologies to improve the performance of GaN HEMTs grown on Si substrates. This invention also allows the fabrication of completely new devices as well as the development of hybrid circuits with GaN HEMTs and Si MOSFETs in close proximity. The first technology, which is called GaN-on-nothing technology, will allow the fabrication of GaN transistors grown on Si without the frequency performance limitations traditionally shown on GaN-on-Si devices. This technology is based on the reduction of parasitic substrate capacitances through the full etching of the Si wafer below the GaN transistors. This technology will also help to reduce buffer leakage currents and to improve the transistor reliability. The technology also has important beneficial effects in the implantation yield in nitrides, ohmic contact resistance as well as in the carrier confinement and gate electrostatic control in these devices. All these new characteristics will allow GaN-on-Si devices to reach a performance level at least similar to the one on GaN-on-SiC devices, at a fraction of the total cost and in a much more scalable technology.

The second key technology will allow the fabrication of Si devices in close proximity to GaN HEMTs in a GaN-on-Si wafer. This technology is based on the selective removal of the AlGaN/GaN epilayer and subsequent processing of the exposed Si (111) wafer.

The low cost of Si wafers and its scalability makes the growth of GaN devices on Si very attractive. This interest is even higher when considering the tremendous possibilities of the integration of GaN devices with Si electronics. The use of AlGaN-GaN wafers is grown on Si with great success. However, the performance of HEMTs fabricated on these wafers has been lower than in other substrates due to the high parasitic capacitance introduced by the Si substrate and the high conductivity of the Si-diffused buffer layer.

In this invention, the well established Si micromachining technology is used to improve the performance of GaN transistors grown on Si beyond the performance achieved in other substrates. To reduce parasitic capacitances and previously mentioned benefits, one can selectively remove the Si carrier wafer in the region underneath an AlGaN/GaN transistor following the process flow shown in FIG. 1.

Figures 1A, 1B, 1C:
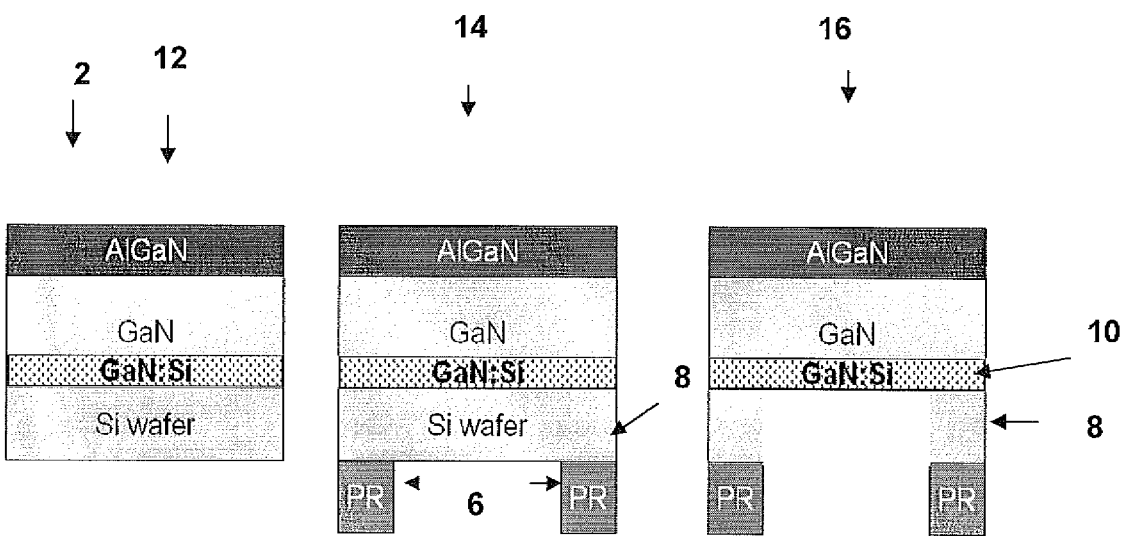
FIGS. 1A-1C are process flow graphs for the selective removal of a Si substrate below AlGaN/GaN HEMTs.

The process flow of FIG. 1A shows an as grown AlGaN/GaN structure on GaN-on-Si wafer 2, as shown in step 12 of FIG. 1B. Photoresists 6 or other masking materials are deposited and defined on the Si substrate 8 of wafer 2 as shown in step 14 and a dry etch is used to remove a portion of the Si substrate 8 so as to expose a portion of the bottom layer of the GaN buffer layer 10 of wafer 4, as shown in step 16 of FIG. 1C.

There are different methods to selectively remove the Si substrate 8. One of them was, for example, developed at the Microsystems Technology Laboratories (MTL) of MIT during the fabrication of substrate via holes. In this technology the Si wafer is selectively etched with a Surface Technology Systems time-multiplexed, inductively-coupled plasma reactive ion etching system available in MTL. This system uses a Bosch etch to fabricate via holes in Si wafers with an aspect ratio of 49:1.

Figure 2:
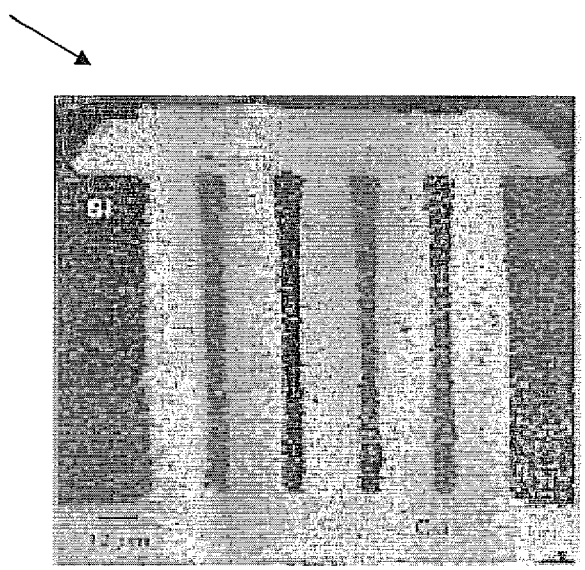
FIG. 2 is a scanning electron micrograph (SEM) of the selective etch if Si substrate in accordance with the invention.

FIG. 2 shows an electron micrograph 18 of some via holes fabricated in Si wafers in MTL. Due to the extremely high chemical stability of nitride semiconductors, the GaN buffer layer will act as a etch stop layer to the Bosch etch ($SF_6$-based etch). There are many other technologies that can be used to etch Si and they should not reduce the generality of the invention.

The selective removal of the Si material below the AlGaN/GaN transistor is the first step to improve the performance of these devices.

FIGS. 3A-3F shows a process flow graph illustrating the formation of an AlGaN/GaN transistor. An AlGaN/GaN wafer 22 is shown in step 20 of FIG. 3A includes a Si-doped GaN buffer layer 24 grown on a Si substrate 26. Photoresist layers 28, 30 are deposited on the bottom side of the Si substrate 26, as shown in step 32 of FIG. 3B. A portion of the Si substrate 26 is removed using a dry etch exposing the Si-doped GaN buffer layer 24, as shown in step 34 of FIG. 3C. AlGaN/GaN transistors grown on Si have important parasitic capacitances due to both the relative high conductivity of the Si substrate 26 and the diffusion of Si atoms into the GaN buffer layer 24 during the high temperature growth of the GaN epilayer 35. By removing the portions of the Si substrate 26 as described herein, the first component of the parasitic capacitances is eliminated.

To reduce the contribution of the Si-doped GaN buffer layer 24, after removing the portions of the Si substrate 26, a portion of the GaN buffer layer 24 is etched with a $Cl_2$-based plasma to remove the Si-doped conductive region, as shown in step 36 of FOG. 3D. This approach will significantly reduce the buffer conductivity and improve the high frequency performance of AlGaN/GaN devices grown on Si. It is expected that the removal of the Si substrate 26 and Si-doped buffer 24 will reduce the parasitic buffer capacitance at least by 50% and the buffer leakage current. The photoresist layers 28, 30 are also removed in step 38 of FIG. 3E. To remove the damage introduced by the $Cl_2$-based plasma etch, a high temperature annealing may be performed in the structure. In step 40 of FIG. 3F, gate 42, source 44, and drain 46 contacts are formed using lithography and deposition while being aligned with wafer backside 46.

Figure 4:
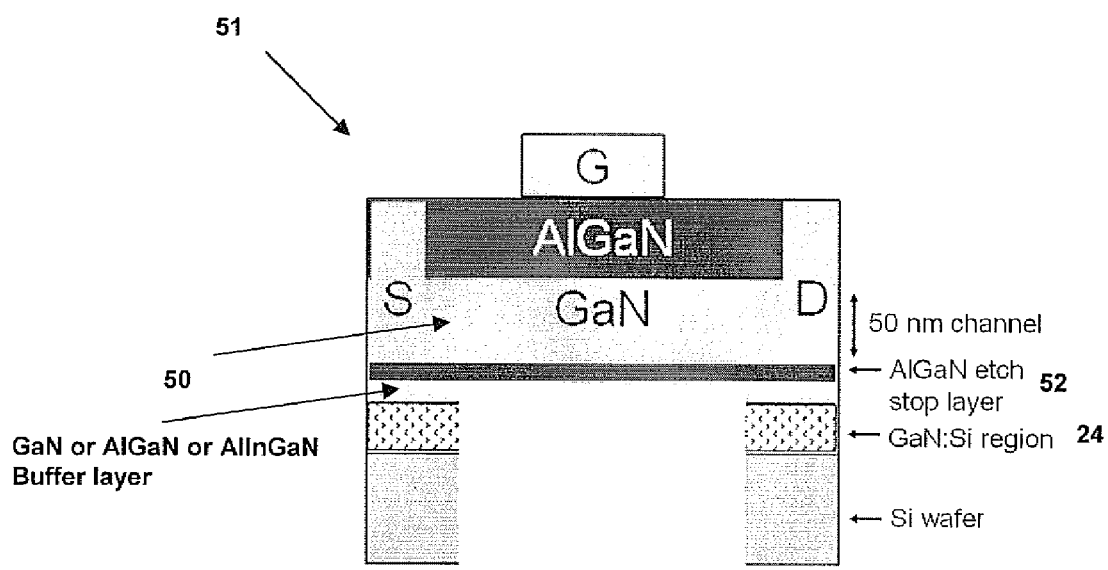
FIG. 4 is a schematic diagram illustrating a thin-body AlGaN/GaN HEMT formed in accordance with invention.

FIG. 4 shows an ultra thing body AlGaN/GaN HEMT structure 51 formed in accordance with the invention as shown in FIG. 3. If the etch of the GaN buffer layer 24 is carefully controlled, it is possible to etch most of the GaN buffer 50 and fabricate ultra thin body AlGaN/GaN HEMT 50 where only 5-100 nm of the GaN buffer layer 50 is left after the etch, as shown in FIG. 4. This device geometry will improve the carrier confinement and the modulation efficiency of the gate, which will significantly increase the high frequency performance of these devices. The proposed device geometry will also be useful to increase the reliability and lifetime of the GaN transistor as it alleviates the internal stress due to the high piezoelectric coefficients and electric fields of these transistors. Thin etch stop layers made of AlGaN, InGaN or InAlGaN layers 52 can be used in the buffer to assure a reproducible etch.

Figure 5:
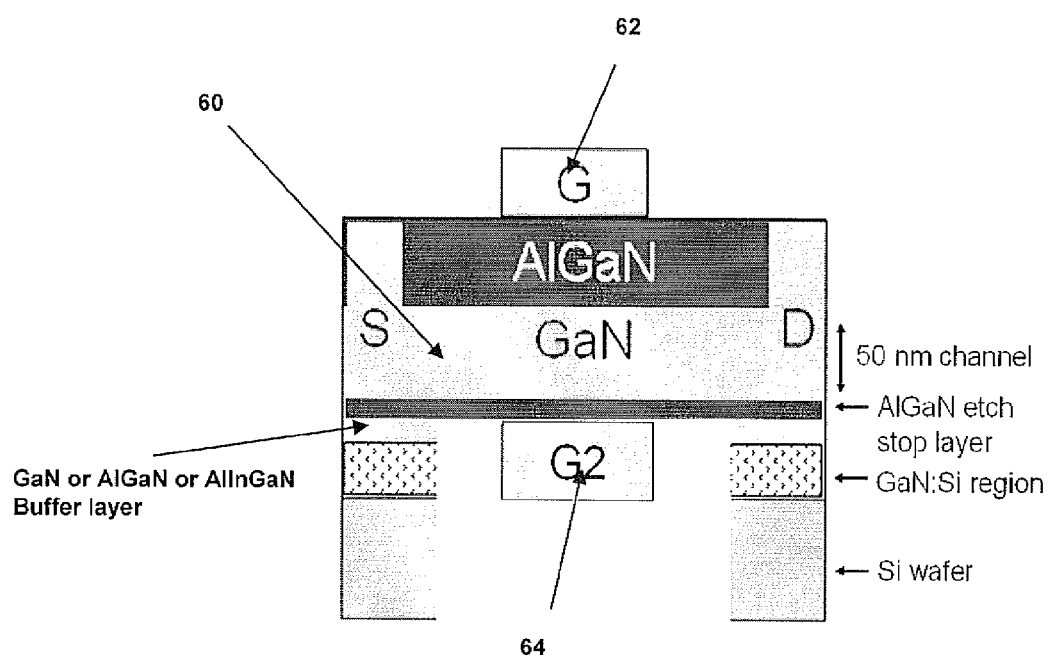
FIG. 5 is a schematic diagram illustrating a double gate GaN HEMT formed in accordance with the invention.

The inventive ultrathin body devices could also benefit from the possibility of depositing metallic contacts in the back side of the wafer, for example on the GaN buffer layer 60. Due to this new technology, devices with a top 62 and bottom gate 64 could be fabricated for the first time in the GaN system, as show in FIG. 5. These devices will significantly improve the electrostatic control of the channel by the gate, enhancing the pinch-off of the devices and increasing the frequency performance.

Another beneficial side-effect of the proposed technology is the increase of the implantation yield. Si implantation is being investigated by several groups to reduce the access resistances in AlGaN/GaN HEMTs, however it has only achieved a limited success due to the poor activation yield of implanted Si in the AlGaN The etch of the Si carrier wafer underneath the transistor and the etch of some of the GaN buffer layer described herein would significantly reduced the distance between the back of the sample and the channel. This reduced distance would allow the use of implantation from the back side of the wafer. With this configuration, most of the implanted atoms will be in GaN and the activation yield will be much higher than in standard devices. Also, as the implantation occurs from the GaN face, it is expected that very limited Al atoms will mix with the GaN buffer due to implantation scattering.

Figure 6A:
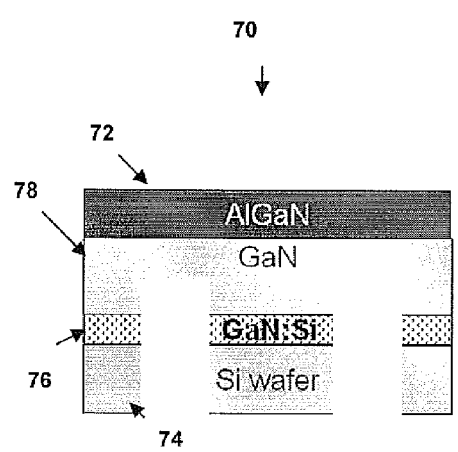
FIGS. 6A-6D are examples of a process flow graph for the implantation of Si from the back side of the wafer to improve the activation yield of Si implanted species.
Figure 6B:
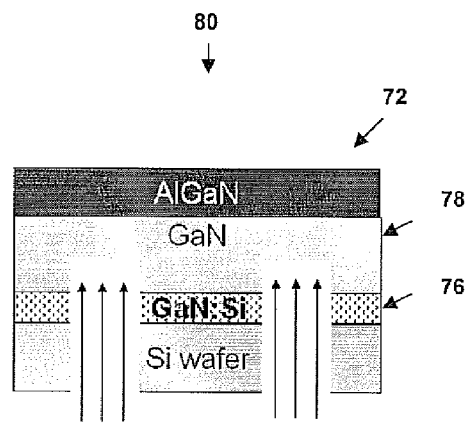
Figure 6C:
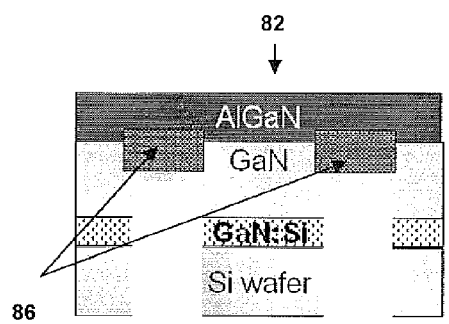
Figure 6D:
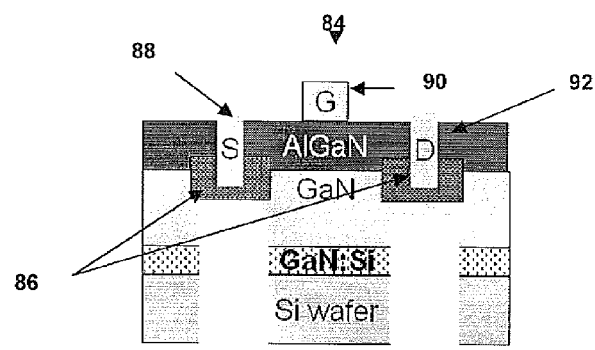

FIGS. 6A-6D shows the process steps of this improved implantation technology. With this new back implantation technology, it would even be possible to fabricate the ohmic contacts on the back side of the wafer, which would allow ultra low ohmic resistances due to the reduction of potential barriers to the electron flow. In particular, FIG. 6A shows a AlGaN/GaN wafer 72 having portions of the wafer's Si substrate 74, Si-doped GaN buffer layer 76, a GaN layer 78 being etched, as shown step 70. Step 80 of FIG. 6B shows Si implantation being performed in the etched regions. Step 82 of FIG. 6C shows high temperature activation of the regions 86 of Si planted atoms. Step 84 of FIG. 6D shows the formation of a source 88, gate 90, and drain 92 on the regions 86 of Si planted atoms using metal deposition. Note the source and drain can be formed on the backside of the wafer 72 as well.

The invention also protects the use of the Si substrate of the GaN-on-Si wafer to process the Si electronics required by the hybrid GaN-Si circuits. Although the standard orientation of Si wafers used in the microelectronics industry is (100), Si (111) has also been used by industry in the fabrication of high performance Si electronics.

Due to the high growth temperatures required during the growth of GaN HEMTs, the processing of the Si devices has to be done after the growth of the AlGaN/GaN epilayers.

The inventive processing is based on the selective removal of the AlGaN/GaN epilayer in the region where the Si devices are going to be processed. The main steps of this process are depicted in a process illustrate in FIGS. 7A-7E. In particular, FIG. 7A show a AlGaN/GaN wafer 112 having a AlGaN layer 116, a GaN epilayer 118, and a Si substrate 114, as shown in step 110. Photoresist layers 122 are formed on the wafer 112, as show in step 120 of FIG. 7B. Portions of the AlGaN layer 116 and GaN epilayer 118 are etched to expose the top surface of the Si substrate 114 as shown in FIG. 7C. The etching of the AlGaN/GaN epilayer can be done with a dry etching system with a combination of $Cl_2$ and $BCl_3$ chemistries. This etching has been proven successful in the etching of thick GaN layers during the process of GaN HEMTs and lasers, as shown in step 126 of FIG. 7C. The photoresist layers 122 are removed as shown in step 128 of FIG. 7D. Step 130 of FIG. 7E shows a Si-based MOSFET structure 132 being formed on the exposed top surface of the Si substrate 114.

The invention allows for the formation of HEMT structures that utilize various nitride-base semiconductor materials. As used herein, the term "nitride semiconductor" refers to those semiconducting compounds formed between nitrogen and other elements in the periodic table, usually aluminum (Al), gallium (Ga), and/or indium (In). The term can refer to binary, ternary, and quaternary compounds such as GaN, AlGaN, and AlInGaN, respectively. These compounds have empirical formulas in which one mole of nitrogen is combined with a total of one mole of the other elements. Accordingly, formulas such as $Al_xGa_{1-x}N$, where $0 \leq x \leq 1$ are often used to describe them. For brevity, when the term AlInGaN is used herein without specification of relative percentages of each element, it will be understood to refer to a compound of the general formula $In_xAl_yGa_zN$ where $x+y+z=1$, $0 \leq x \leq 1$, $0 \leq y \leq 1$, $0 \leq z \leq 1$. Thus, as used herein, the term InAlGaN may refer to GaN, InN, AlN, AlGaN, AlInN, InGaN, and/or AlInGaN unless otherwise specified or limited. Accordingly, the terms "InAlGaN", "nitride semiconductor", and "nitride-based semiconductor" are used interchangeably throughout this specification. Likewise, when the term AlGaN is used herein without specification of relative percentages of each element, it will be understood to refer to a compound of the general formula AlxGayN where $x+y=1$, $0 \leq x \leq 1$, $0 \leq y \leq 1$. Also, the term AlGaN may refer to GaN, AlN, and/or AlGaN unless otherwise specified or limited.

Figure 8:
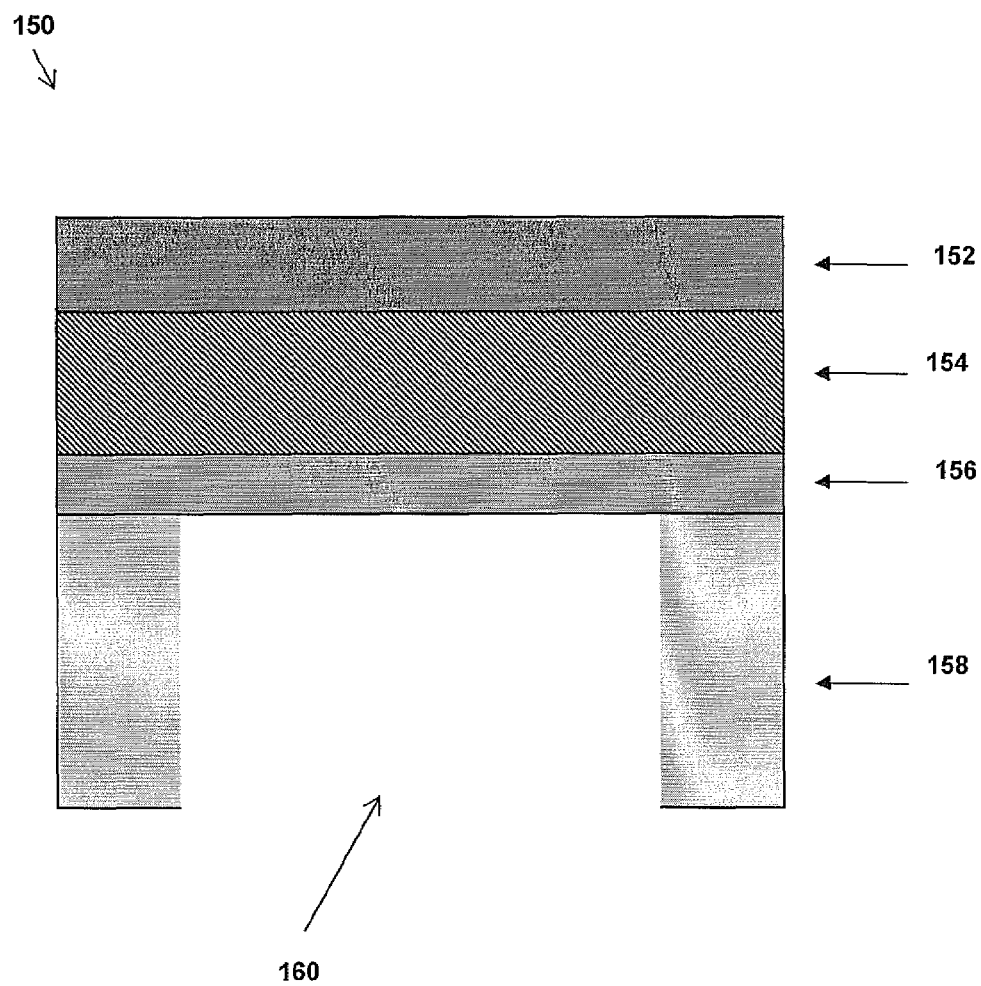
FIG. 8 is a schematic diagram illustrating a HEMT structure having a buffer layer that includes one or more InAlGaN layers.

FIG. 8 illustrates a HEMT structure 150 having a buffer layer that includes one or more InAlGaN layers. The HEMT structure 150 includes a barrier layer 152 positioned on a channel layer 154 to allow for electrical conduction in the HEMT structure 150. The channel layer 154 is positioned on a buffer layer 156. In this embodiment of the invention, the buffer layer 156 can include one or more layers of InAlGaN layers that are formed on a substrate 158. Also, the buffer layer 156 can include crystalline or amorphous layers as well as doped and undoped layers. The substrate 158 can be partially etched to reduce its thickness underneath the buffer layer 156 or is completely etched to expose the bottom surface of the buffer layer 156 thru an etched region 160. The barrier layer 152 can include one or more AlGaN layers and the channel layer 154 can include GaN. The buffer layer 156 can be partially etched to reduce its thickness underneath the channel layer 154 or is completely etched to expose the bottom surface of the channel layer 154 thru an etched region 160.

Figure 9:
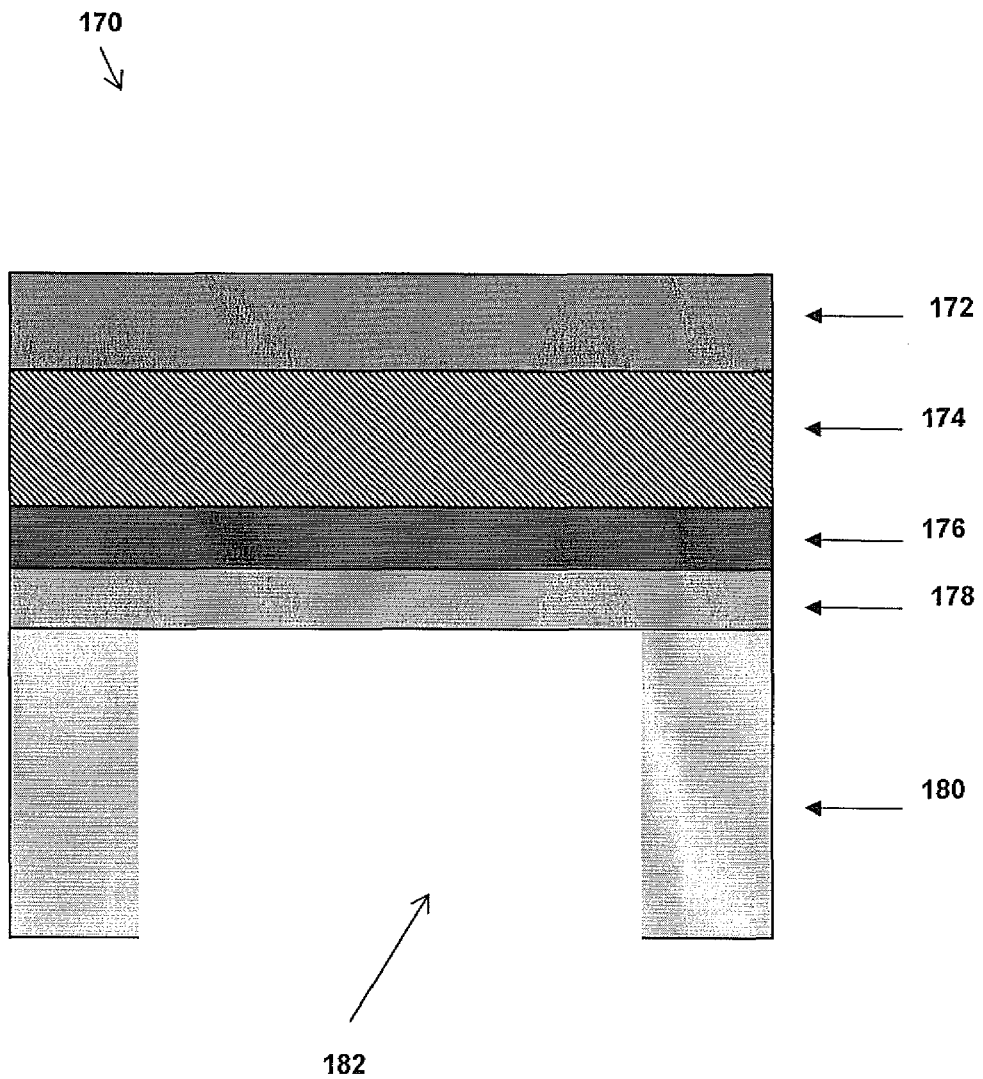
FIG. 9 is a schematic diagram illustrating a HEMT structure having an etch-stop layer.

FIG. 9 illustrates a HEMT structure 170 having an etch-stop layer. The HEMT structure 170 includes a barrier layer 172 positioned on a channel layer 174 to allow for electrical conduction in the HEMT structure 170. The channel layer 174 is positioned on an etch-stop layer 176. The etch-stop layer 176 is formed on a buffer layer 178. In this embodiment of the invention, the buffer layer 178 can include one or more layers of InAlGaN layers that are formed on a substrate 180. Also, the buffer layer 178 can include crystalline or amorphous layers as well as doped and undoped layers. The substrate 180 can be partially etched to reduce its thickness underneath the buffer layer 178 or is completely etched to expose the bottom surface of the buffer layer 178 thru an etched region 182. The barrier layer 172 can include one or more AlGaN layers and the channel layer 174 can include GaN. The buffer layer 178 can be partially etched to reduce its thickness underneath the etch-stop layer 176 or is completely etched to expose the bottom surface of the etch-stop layer 176 thru an etched region 182.

Figure 10:
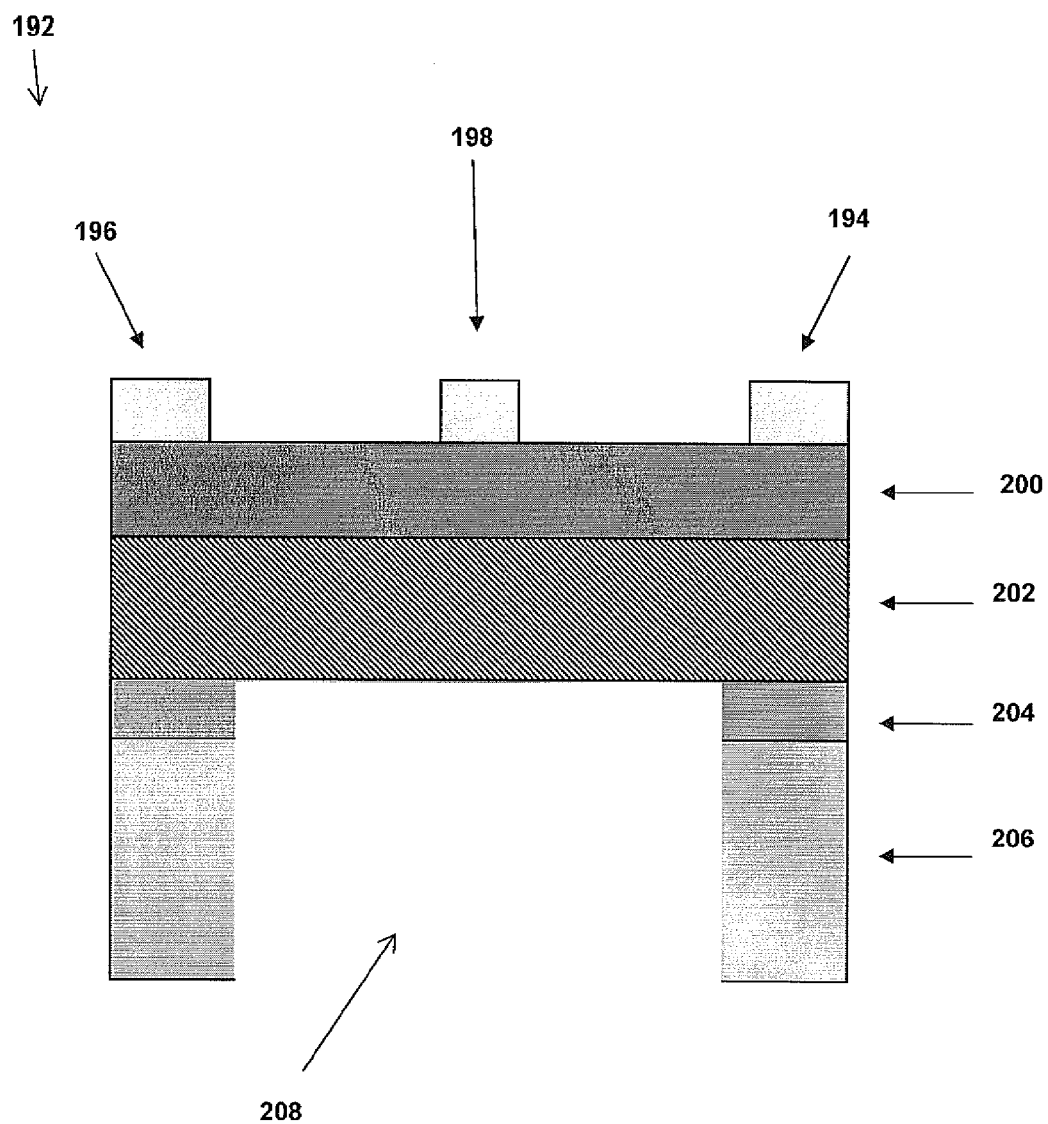
FIG. 10 is a schematic diagram illustrating a HEMT structure having an etched buffer layer.

FIG. 10 illustrates a HEMT structure 192 having an etched buffer layer. The HEMT structure 192 includes a barrier layer 200 positioned on a channel layer 202 to allow for electrical conduction in the HEMT structure 192. The channel layer 202 is positioned on a buffer layer 204. In this embodiment of the invention, the buffer layer 204 can include one or more layers of InAlGaN layers that are formed on a substrate 206. Also, the buffer layer 204 can include crystalline or amorphous layers as well as doped and undoped layers. Both the substrate 206 and buffer layer 204 can be locally etched to reduce their thicknesses underneath the channel layer 202 or is completely locally etched to expose the bottom surface of the channel layer 202 thru an etched region 208. The barrier layer 200 can include one or more AlGaN layers and the channel layer 202 can include GaN. Moreover, a gate contact 198 is positioned on the barrier layer 200 as well electrical contacts 194, 196. The electrical contacts can be used to define either a drain or source for the HEMT structure 192.

Figure 11:
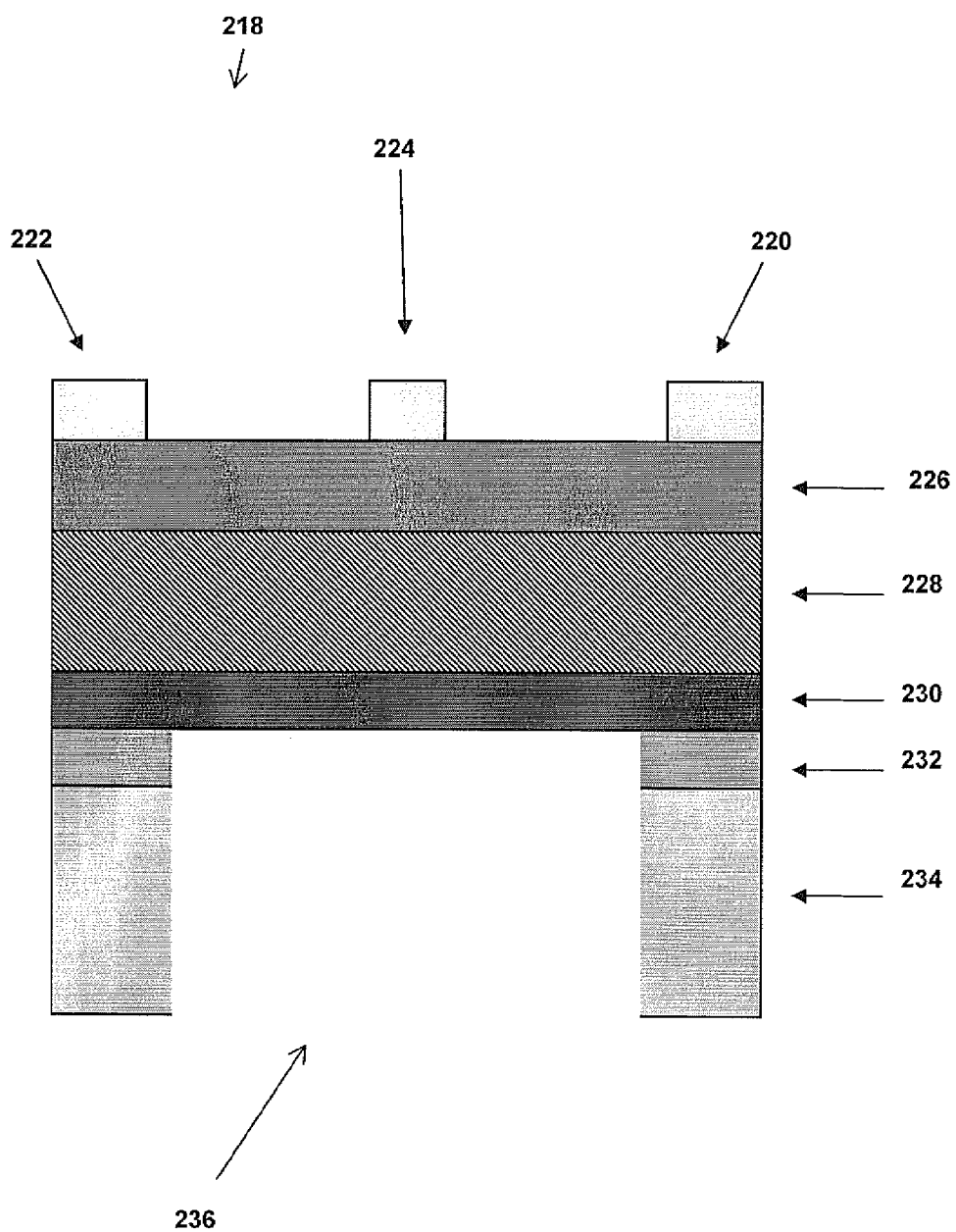
FIG. 11 is a schematic diagram illustrating HEMT structure having an etched buffer layer and etched etch-stop layer.

FIG. 11 illustrates a HEMT structure 218 having an etched buffer layer and etched etch-stop layer. The HEMT structure 218 includes a barrier layer 226 positioned on a channel layer 228 to allow for electrical conduction in the HEMT structure 218. The channel layer 228 is positioned on an etch-stop layer 230. The etch-stop layer 230 is formed on a buffer layer 232. In this embodiment of the invention, the buffer layer 232 can include one or more layers of InAlGaN layers that are formed on a substrate 234. Also, the buffer layer 232 can include crystalline or amorphous layers. Both the substrate 234 and buffer layer 232 can be locally etched to reduce their thicknesses underneath the etch-stop layer 230 or are completely locally etched to expose the bottom surface of the etch-stop layer 230 thru an etched region 236. The barrier layer 226 can include one or more AlGaN layers and the channel layer 228 can include GaN. Moreover, a gate contact 224 is positioned on the barrier layer 226 as well electrical contacts 220, 222. The electrical contacts 220, 222 can be used to define either a drain or source for the HEMT structure 218.

Figure 12:
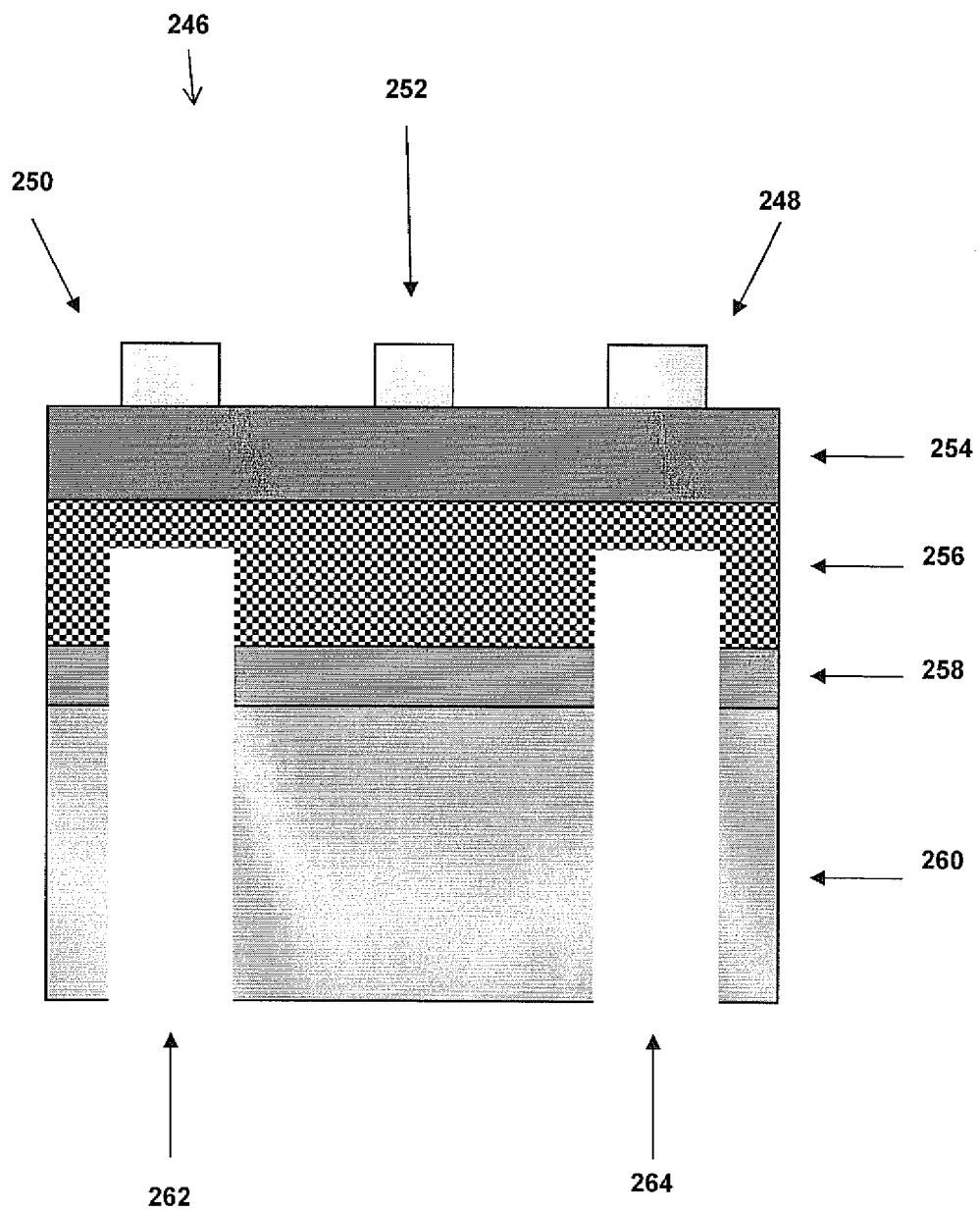
FIG. 12 is a schematic diagram illustrating a HEMT structure having trenched regions.

FIG. 12 illustrates a HEMT structure 246 having trenched regions. The HEMT structure 246 includes a barrier layer 254 positioned on a channel layer 256 to allow for electrical conduction in the HEMT structure 246. The channel layer 256 is positioned on a buffer layer 258. In this embodiment of the invention, the buffer layer 258 can include one or more layers of InAlGaN layers that are formed on a substrate 260. Also, the buffer layer 258 can include crystalline or amorphous layers. The HEMT structure 246 includes trenched regions 262, 264 where each of the trenched regions 262, 264 have an etched region that encompasses the substrate 260, buffer layer 258, and channel layer 256 where an area of the bottom surface of the channel layer 256 is exposed. The channel layer 256 can be partially etched thru etched regions 262 and 264 to reduce its thickness underneath the barrier layer 254. The barrier layer 254 can include one or more AlGaN layers and the channel layer 256 can include GaN. Moreover, a gate contact 252 is positioned on the barrier layer 254 as well as electrical contacts 248, 250 using metal contacts. Ohmic contacts can be formed on the channel layer to establish electrical connections with the electrical contacts 248, 250 to form a source and drain. A conductivity enhancing treatment is performed on the channel layer 256 such as ion implantation (e.g. Si) through the trenches 262, 264 forming implanted regions in the channel layer 256. The electrical connections between the electrical contacts 248, 250 and the implanted regions in the channel layer 256 are formed by thermal annealing.

Figure 13:
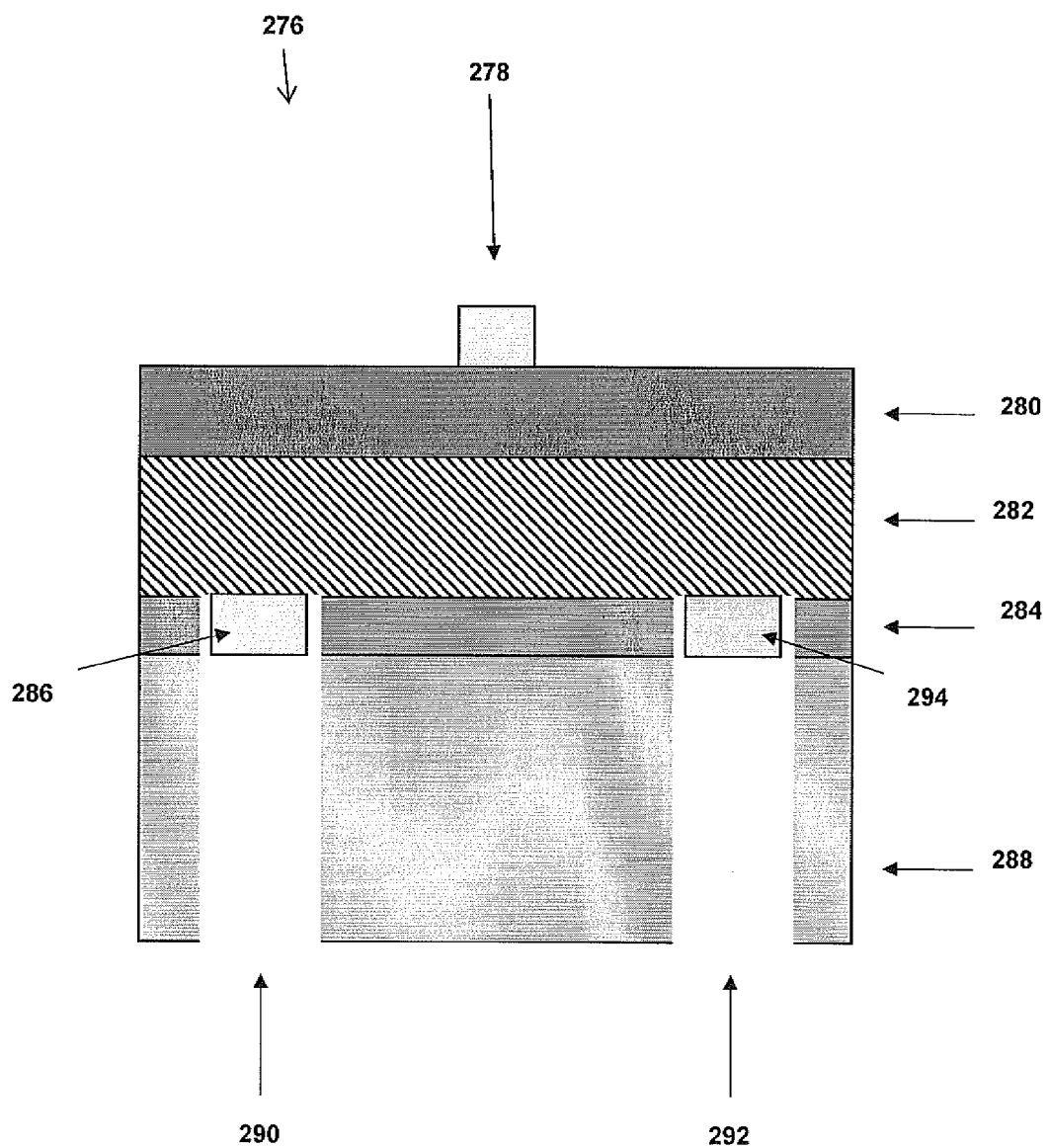
FIG. 13 is a schematic diagram illustrating another embodiment of a HEMT structure having trenched regions.

FIG. 13 illustrates another embodiment of a HEMT structure 276 having trenched regions. The HEMT structure 276 includes a barrier layer 280 positioned on a channel layer 282 to allow for electrical conduction in the HEMT structure 276. The channel layer 282 is positioned on a buffer layer 284. In this embodiment of the invention, the buffer layer 284 can include one or more layers of InAlGaN layers that are formed on a substrate 288. Also, the buffer layer 284 can include crystalline or amorphous layers. The HEMT structure 276 includes trenched regions 290, 292 where each of the trenched regions 290, 292 have an etched region that encompasses the substrate 288 and buffer layer 284 where an area of the bottom surface of the channel layer 282 is exposed. The channel layer 282 can be partially etched thru etched regions 290 and 292 to reduce its thickness underneath the barrier layer 280. The barrier layer 280 can include one or more AlGaN layers and the channel layer 282 can include GaN. Moreover, a gate contact 278 is positioned on the barrier layer 280. A conductivity enhancing treatment is performed on the channel layer 282 such as ion implantation (e.g. Si) through the trenches 290, 292 forming implanted regions in the channel layer 282. The electrical contacts 286, 294 are formed underneath the exposed surface of the channel layer 282 to define either a drain or source for the HEMT structure 276 using metal contacts. Also, source and drain ohmic contacts can be formed to be in electrical communication with the channel layer 282 to form the source and drain. The electrical connections between the electrical contacts 286, 294 and the implanted region in the channel layer 282 are formed by thermal annealing.

Although silicon, sapphire, and silicon carbide are the preferred semiconductors material for the substrates 158, 180, 206, 234, 260, 288, embodiments of the present invention can utilize any suitable substrate, such as diamond, GaN, GaAs, InP and the like.

Also a passivation layer comprising one or more $Si_xN_y$, $SiO_2$, and $Al_2O_3$ layers can be formed on the barrier layers 152, 172, 200, 226, 254, 280, and/or underneath the channel layers 154, 174, 202, 228, 256, 282, and/or underneath the etch-stop layers 176, 230 described herein.

In other embodiments of the invention, an AlN layer can be disposed between the barrier layers 152, 172, 200, 226, 254, 280 and the channel layers 154, 174, 202, 228, 256, 282 described herein.

The invention allows a substantial reduction in the cost of GaN-based transistors which will revolutionize the high frequency electronic market. The tremendous performance, at an affordable price, of these new devices will allow the introduction of a great variety of new applications, from cell phone base stations, to anti-collision radar systems, digital electronics, or the like.

Also, the new devices enabled by the proposed technology, such as double gate and ultra-low access resistance transistors, will allow the use of these devices at much higher frequencies and it may even allow the use of these devices in a future beyond-Si digital electronics.

Although the present invention has been shown and described with respect to several preferred embodiments thereof, various changes, omissions and additions to the form and detail thereof, may be made therein, without departing from the spirit and scope of the invention.

What is claimed is:

1. A nitride-based semiconductor device comprising:
a substrate comprising one or more locally etched regions;
a buffer layer comprising one or multiple InAlGaN layers on the substrate;
a channel layer comprising GaN on the buffer layer; and
a barrier layer comprising one or multiple AlGaN layers on the channel layer.

2. The nitride-based semiconductor device of claim 1, wherein the buffer layer comprises crystalline or amorphous layers.

3. The nitride-based semiconductor device of claim 1, wherein the buffer layer comprises doped or undoped layers.

4. The nitride-based semiconductor device of claim 1 further comprising an AlN layer disposed between the channel and the barrier layer.

5. The nitride-based semiconductor device of claim 1, wherein the substrate is partially etched to reduce the thickness of the substrate underneath the buffer layer.

6. The nitride-based semiconductor device of claim 1, wherein the substrate is completely etched to expose the surface of the buffer layer.

7. The nitride-based semiconductor device of claim 6, wherein the buffer layer is partially etched to reduce the thickness of the buffer layer underneath the channel layer.

8. The nitride-based semiconductor device of claim 6, wherein the buffer layer is completely etched to expose the surface of the channel layer.

9. The nitride-based semiconductor device of claim 8, wherein the channel layer is partially etched to reduce the thickness of the channel layer underneath the barrier layer.

10. A nitride-based semiconductor device comprising:
a substrate comprising one or more locally etched regions;
a buffer layer comprising one or more InAlGaN layers on the substrate;
an etch-stop layer comprising InAlGaN on the buffer layer;
a channel layer comprising GaN on the etch-stop layer; and a barrier layer comprising one or more AlGaN layers on the channel layer.

11. The nitride-based semiconductor device of claim 10, wherein the buffer layer comprises crystalline or amorphous layers.

12. The nitride-based semiconductor device of claim 10, wherein the buffer layer comprises doped or undoped layers.

13. The nitride-based semiconductor device of claim 10 further comprising an AlN layer disposed between the channel and the barrier layer.

14. The nitride-based semiconductor device of claim 10, wherein the substrate is partially or completely etched to expose the surface of the buffer layer.

15. The nitride-based semiconductor device of claim 14, wherein the buffer layer is partially or completely etched to expose the surface of the etch-stop layer.

16. A field effect transistor comprising:
a substrate comprising one or more locally etched regions;
a buffer layer comprising one or more InAlGaN layers with one or more locally etched regions on the substrate;
a channel layer comprising GaN on the buffer layer;
a barrier layer comprising one or more AlGaN layers positioned on the channel layer;
a plurality of ohmic contacts in electrical communication with the channel layer to form a source or drain; and
one or more gate contacts on the barrier layer.

17. The field effect transistor of claim 16 further comprising an AlN layer disposed between the channel and the barrier layer.

18. The semiconductor device of claim 16, wherein the one or more gate contacts are underneath the channel layer.

* * * * *

UNITED STATES PATENT AND TRADEMARK OFFICE
CERTIFICATE OF CORRECTION

PATENT NO. : 8,188,459 B2
APPLICATION NO. : 12/577892
DATED : May 29, 2012
INVENTOR(S) : Tomas Palacios Page 1 of 1

It is certified that error appears in the above-identified patent and that said Letters Patent is hereby corrected as shown below:

In the section titled 'PRIORITY INFORMATION', after column 1, line 2, Please add the following paragraph starting at line 11:

--This invention was made with government support under Grant No. N00014-05-1-0419 awarded by the U.S. Navy. The government has certain rights in this invention.--

Signed and Sealed this
Twenty-seventh Day of November, 2012

David J. Kappos
*Director of the United States Patent and Trademark Office*